(12) United States Patent
Citla et al.

(10) Patent No.: US 12,315,718 B2
(45) Date of Patent: May 27, 2025

(54) FORMING FILMS WITH IMPROVED FILM QUALITY

(71) Applicant: Applied Materials, Inc., Santa Clara, CA (US)

(72) Inventors: Bhargav S. Citla, Fremont, CA (US); Srinivas D. Nemani, Saratoga, CA (US); Purvam Modi, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 406 days.

(21) Appl. No.: 17/873,597

(22) Filed: Jul. 26, 2022

(65) Prior Publication Data

US 2024/0038527 A1 Feb. 1, 2024

(51) Int. Cl.
*H01L 21/02* (2006.01)
*H01L 21/3065* (2006.01)
*H01L 21/321* (2006.01)

(52) U.S. Cl.
CPC .. *H01L 21/02274* (2013.01); *H01L 21/02126* (2013.01); *H01L 21/3065* (2013.01); *H01L 21/3211* (2013.01)

(58) Field of Classification Search
None
See application file for complete search history.

(56) References Cited

U.S. PATENT DOCUMENTS

| | | |
|---|---|---|
| 2016/0079058 A1 | 3/2016 | Jongbloed et al. |
| 2017/0323803 A1 | 11/2017 | Van Schravendijk et al. |
| 2018/0148833 A1* | 5/2018 | Chatterjee ......... H01L 21/02126 |
| 2022/0020594 A1 | 1/2022 | Jiang et al. |
| 2022/0028680 A1 | 1/2022 | Vats et al. |
| 2022/0037147 A1 | 2/2022 | Kim et al. |

FOREIGN PATENT DOCUMENTS

WO 2006130838 A2 12/2006

OTHER PUBLICATIONS

Applied Materials, Semiconductor, "Centura DPN HD", https://origin-www.appliedmaterials.com/products/centura-dpn-hd, [retrieved from the internet on Jun. 13, 2022], 4 pages.
Application No. PCT/US2023/028030, International Search Report and the Written Opinion, Mailed On Nov. 14, 2023, 9 pages.

* cited by examiner

*Primary Examiner* — Asok K Sarkar
(74) *Attorney, Agent, or Firm* — Kilpatrick Townsend & Stockton LLP

(57) ABSTRACT

A method includes depositing a flowable film on a substrate by providing a first input flow, the first input flow including plasma effluents of a first precursor, removing a portion of the flowable film from a sidewall of a feature defined within the substrate to obtain a remaining portion of the flowable film by providing a second input flow, the second input flow including plasma effluents of a second precursor, reducing hydrogen content of the remaining portion of the flowable film to obtain a densified film by providing a third input flow, the third input flow including plasma effluents of a third precursor, and treating the densified film in accordance with a film treatment process.

20 Claims, 7 Drawing Sheets

FORMING FILMS WITH IMPROVED FILM QUALITY

TECHNICAL FIELD

This present technology relates to semiconductor processing. More specifically, the present technology relates to forming films with improved film quality.

BACKGROUND

An electronic device manufacturing system may include one or more process chambers in which substrates are processed to fabricate thereon electronic devices (e.g., integrated circuits and/or flatpanel displays). The process chambers may be operated at a vacuum level (e.g., ranging from about 0.01 Torr to about 80 Torr) and at high temperatures (e.g., ranging from about 100° C. to about 700° C.). A same or different substrate process may take place in each process chamber of the electronic device manufacturing system. Substrate processing may also occur in a load lock of some electronic device manufacturing systems. A load lock is a chamber through which substrates are transferred between process chambers and a factory interface for transport elsewhere in an electronic device manufacturing system.

SUMMARY

According to yet another aspect, a method is provided. The method includes depositing a flowable film on a substrate by providing a first input flow, the first input flow including plasma effluents of a first precursor, removing a portion of the flowable film from a sidewall of a feature defined within the substrate to obtain a remaining portion of the flowable film by providing a second input flow, the second input flow including plasma effluents of a second precursor, reducing hydrogen content of the remaining portion of the flowable film to obtain a densified film by providing a third input flow, the third input flow including plasma effluents of a third precursor, and treating the densified film in accordance with a film treatment process.

According to another aspect, a system is provided. The system includes at least one system controller including a processor operatively coupled to a memory. The at least one system controller is configured to cause a flowable film to be deposited on a substrate by causing a first input flow to be provided, the first input flow including plasma effluents of a first precursor, cause a portion of the flowable film to be removed from a sidewall of a feature defined within the substrate to obtain a remaining portion of the flowable film by causing a second input flow to be provided, the second input flow including plasma effluents of a second precursor, cause hydrogen content of the remaining portion of the flowable film to be reduced to obtain a densified film by causing a third input flow to be provided, the third input flow including plasma effluents of a third precursor, and cause the densified film to be treated using a film treatment process.

According to yet another aspect, a system is provided. The system includes a process chamber including a first substrate support, a film treatment chamber including a second substrate support, a transfer chamber coupled to the process chamber and the film treatment chamber, wherein the transfer chamber houses a transfer robot, and at least one system controller, operatively coupled to the process chamber, the film treatment chamber and the transfer robot. The at least one system controller is configured to cause the transfer robot to load a substrate on the first substrate support within the process chamber, wherein the substrate includes a feature defined within the substrate, cause a flowable film to be deposited on the substrate within the process chamber by causing a first input flow to be provided within a processing volume of the process chamber, the first input flow including plasma effluents of a first precursor, cause, within the process chamber, a portion of the flowable film to be removed from a sidewall of the feature to obtain a remaining portion of the flowable film by causing a second input flow to be provided within the processing volume, the second input flow including plasma effluents of a second precursor, cause, within the process chamber, hydrogen content of the remaining portion of the flowable film to be reduced to obtain a densified film by causing a third input flow to be provided within the processing volume, the third input flow including plasma effluents of a third precursor, cause the transfer robot to transfer the substrate from the process chamber to the film treatment chamber and on the second substrate support, and cause the densified film to be treated within the film treatment chamber using a film treatment process.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF DRAWINGS

The drawings, described below, are provided for illustrative purposes only and are not necessarily drawn to scale. The drawings are not intended to limit the scope of the disclosure in anyway.

DETAILED DESCRIPTION

Figure 1:
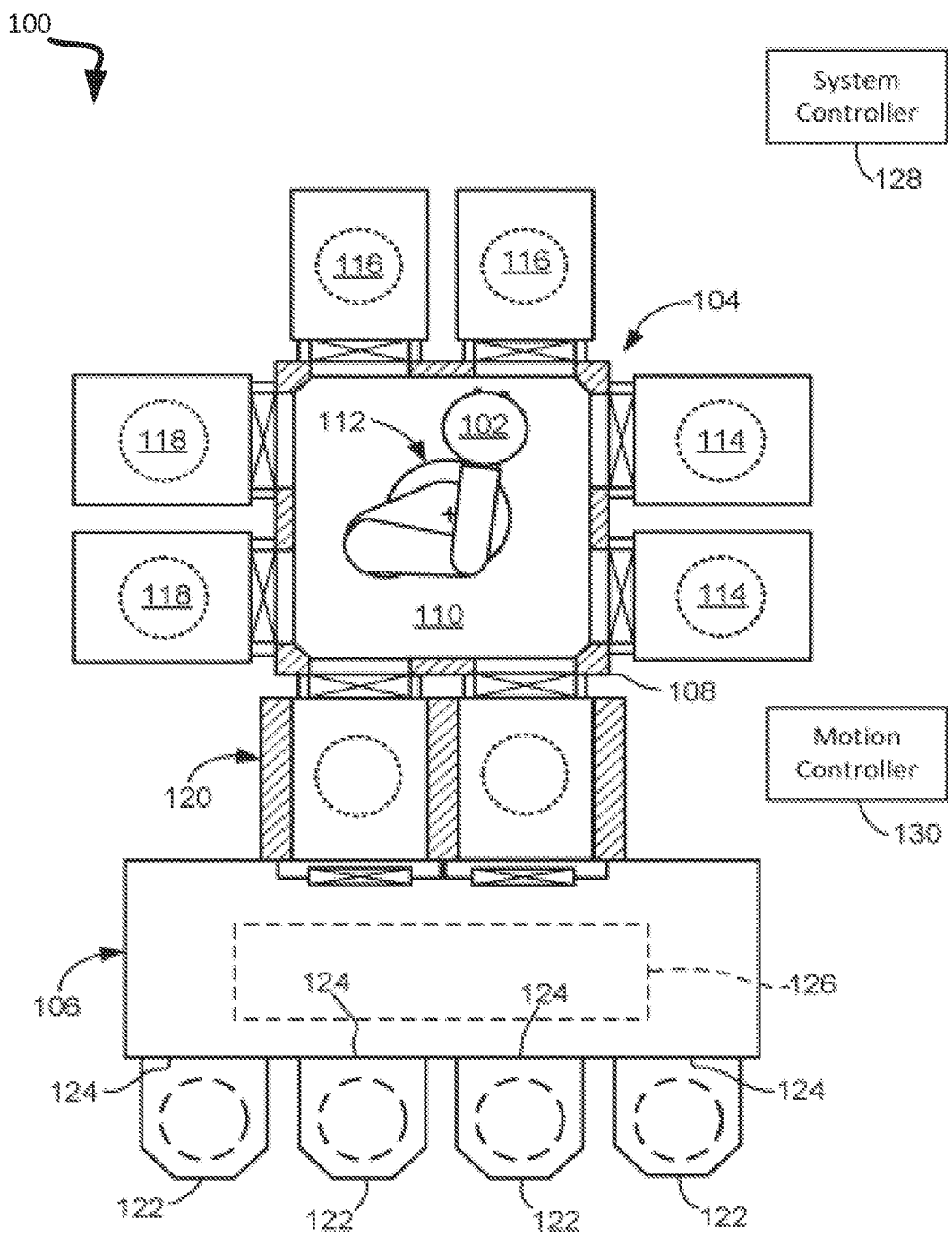
FIG. 1 is a schematic top-down view of an electronic device manufacturing system, according to some embodiments.

Aspects of the present disclosure are directed to forming films (e.g., silicon thin films) with improved film quality. Electronic devices, such as integrated circuits, are made possible by processes which produce intricately patterned material layers on substrate surfaces. Producing patterned material on a substrate requires controlled methods of formation and removal of exposed material. As device sizes continue to shrink, material formation may affect subsequent operations. For example, in gap filling operations, a material may be formed or deposited to fill a trench or other feature formed on a semiconductor substrate. As features may be characterized by higher aspect ratios and reduced critical dimensions, these filling operations may be challenged. For example, as the deposition may occur at the top and along sidewalls of the feature, continued deposition may pinch off the feature including between sidewalls within the feature and may produce voids within the feature. This can impact device performance and subsequent processing operations.

Amorphous silicon may be used in semiconductor device manufacturing for a number of structures and processes, including as a sacrificial material, for example as a dummy gate material, or as a trench fill material. In gap filling operations, some processing may utilize flowable films formed under process conditions to limit conformality of deposition, which may allow the deposited material to better fill features on the substrate. Flowable silicon material may be characterized by relatively high amounts of hydrogen and may be less dense than other formed films. Consequently, subsequent treatment operations may be performed to cure the produced films. Some implementations may utilize a UV curing process to remove hydrogen and process the film. However, UV curing may result in significant film shrinkage, which may cause stress on features as well as produce voids within the structure.

As feature sizes continue to shrink, flowable films may be challenging for narrow features, which may be further characterized by higher aspect ratios. For example, pinching of the feature may more readily occur due to deposition on sidewalls of the feature, which in small feature sizes may further restrict flow further into the feature, and may produce voids. Additionally, for processes in which conversion of the amorphous silicon may be performed, expansion of the sidewall materials during conversion may further restrict access within the feature.

Aspects of the present disclosure address the above and other deficiencies by forming films with improved film quality. Embodiments described herein can selectively form a film (e.g., thin film). More specifically, selectively forming the film can include depositing a flowable film using a suitable deposition process, and using a dry etch process to remove a portion of the flowable film from sidewalls to obtain a remaining portion of the flowable film within the feature. The dry etch process is capable of removing lower quality material from the sidewalls, while maintaining denser material within the feature. In some embodiments, the dry etch process is a plasma etch process (e.g., hydrogen ($H_2$) etch process). This may limit or prevent sidewall coverage during trench fill, allowing improved fill operations to be performed. Thus, during the selective deposition process, material can be formed in a feature that may not be performed on material deposited on the sidewalls.

In some embodiments, the film includes silicon (Si). For example, the film can be a Si film. The Si film can have a nitrogen (N) concentration of about 0%, a Si concentration of about 99% and an oxygen (O) concentration of about 1%. Additionally, the Si film can have a wet etch rate of less than about 8 Angstroms (Å) per minute, assuming a 1:500 dilute hydrofluoric acid (DHF) etchant for 60 seconds. The remaining portion of the Si film can have a thickness between about 5 nm to about 10 nm, and a sidewall thickness of less than about 2 nm.

The deposition process can be performed using any suitable process window parameters. In some embodiments, the deposition process is performed at a temperature between about 25° C. to about 100° C. More specifically, the temperature can be about 80° C. In some embodiments, the deposition process is performed at a source power between about 60 Watts (W) to about 250 W. In some embodiments the selective deposition process is performed at a bias power between about 100 W to about 200 W. In some embodiments, the deposition process is performed with plasma pulsing having a duty cycle between about 1% to about 99%, and a frequency between about 1 Hertz (Hz) to about 20 Hz. In some embodiments, the deposition process is performed at a pressure between about 0.5 Torr to about 5 Torr. In some embodiments, the deposition process is performed for a time ranging from about 5 seconds (s) to about 15 s. More specifically, the deposition process can be performed for about 13 s.

Embodiments described herein can further treat the film in accordance with a film treatment process. The film treatment process can be used to incorporate a material within the film (e.g., an upper surface of the film). The treated film can have, for example, an improved wet etch rate relative to the wet etch rate of the film. The selective deposition process and the film treatment process can be performed in respective process chambers (e.g., the film treatment process can be an ex-situ process).

In some embodiments, the film treatment chamber is a plasma film treatment chamber for performing a plasma film treatment process. For example, the plasma film treatment process can be an inductively coupled plasma (ICP) plasma film treatment process. In some embodiments, the film treatment chamber is a nitridation chamber to perform a nitridation process. For example, the film treatment chamber can be a decoupled plasma nitridation (DPN) chamber to perform a DPN process, although the plasma employed need not be "decoupled." For example, the film treatment chamber can be a DPN chamber of the 300 mm DPN Centura® system available from Applied Materials, Inc. of Santa Clara, CA.

During the DPN process, a film can be treated by infusing the film with nitrogen using low-energy, pulsed plasma to create the desired nitrogen concentration at respective interfaces for preserving high channel mobility. Direct, high temperature wafer heating performed during the DPN process can generate the higher dosages of nitrogen needed for oxynitride gates at the 3× and 2× nm nodes while simultaneously achieving improved leakage and threshold voltage performance. Other nitridation processes can be limited in achieving the requisite leakage and threshold voltage.

For example, the DPN process can be used to form a silicon nitride material (e.g., $Si_xN_y$) from a Si film. The silicon nitride material formed using the DPN process described herein can have an improved wet etch rate relative to the Si film. For example, the silicon nitride material can have a wet etch rate of less than about 4 Å per minute, assuming a 1:500 DHF etchant for 60 seconds. In some embodiments, the silicon nitride material has a wet etch rate of less than about 1 Å per minute, assuming a 1:500 DHF etchant for 60 seconds. In some embodiments, the silicon nitride material has a wet etch rate of about 0.6 Å per minute, assuming a 1:500 DHF etchant for 60 seconds. The silicon nitride material can have an N concentration of about 55%, a Si concentration of about 45% and an O concentration of about 0%.

The film treatment process can be performed using any suitable process window parameters. Illustratively, in some embodiments, a DPN process can be performed at a temperature between about 200° C. to about 500° C. More specifically, the temperature can be about 450° C. In some embodiments, the DPN process is performed at a source power between about 100 W to about 250 W. More specifically, the source power can be about 150 W. In some embodiments the DPN process is performed at a bias power between about 100 W to about 600 W. More specifically, the bias power can be about 400 W. In some embodiments, the DPN process is performed at a pressure between about 5 milliTorr to about 100 milliTorr. In some embodiments, the DPN process is performed for a time ranging from about 5 seconds (s) to about 15 s. More specifically, the DPN process can be performed for about 10 s.

The concentration of the matter used to treat the film (e.g., nitrogen) can decrease over time following the treatment. To counteract this effect, a high temperature anneal can be performed immediately following the film treatment process. The high temperature anneal can be performed in a separate chamber from the film treatment process. For example, a high temperature anneal performed immediately following the film treatment process can be referred to as a post-nitridation anneal (PNA). PNA can also eliminate an unstable bonding phase from the nitridation process that can cause variation in threshold voltage. By reducing or removing this unstable bonding phase, the PNA can contribute to improved device performance.

FIG. 1 illustrates an electronic device manufacturing system 100 in accordance with one or more embodiments. Electronic device manufacturing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon. In some embodiments, the substrate may be, e.g., a 200 mm, 300 mm or 450 mm diameter semiconductor wafer.

Electronic device manufacturing system 100 may include a process tool 104 and a factory interface 106 coupled to process tool 104. Process tool 104 may include a housing 108 having a transfer chamber 110 therein, and transfer chamber 110 may have a transfer robot 112 housed within the transfer chamber 110. A number of process chambers 114, 116, and 118 may be coupled to housing 108 and transfer chamber 110. A load lock 120 may also be coupled to housing 108 and transfer chamber 110. Transfer chamber 110, process chambers 114, 116, and 118, and load lock 120 may be maintained at a vacuum level. The vacuum level for transfer chamber 110 may range from about, e.g., 0.01 Torr to about 80 Torr. Other vacuum levels may be used.

Transfer robot 112 may include multiple arms and one or more end effectors that are configured to transfer substrates 102 to and from any process chamber and load lock physically coupled to transfer chamber 110 (note that substrates 102 and substrate placement locations are shown in FIG. 1 as circles).

A same or different substrate process may take place on one or more substrates in each of process chambers 114, 116, and 118. Example of substrate processes include selective film deposition (e.g., using atomic layer deposition (ALD), physical vapor deposition (PVD), chemical vapor deposition (CVD)) nitridation, etching, annealing, curing, pre-cleaning, metal or metal oxide removal, etc. Further details regarding selective film deposition and nitridation that can be performed to improve film quality will be described herein below with reference to FIGS. 2-6.

Load lock 120 may be configured to interface with, and be coupled to, transfer chamber 110 on one side and factory interface 106 on an opposite side. Load lock 120 may have an environmentally controlled atmosphere that may be changed from a vacuum environment (wherein substrates may be transferred to and from transfer chamber 110) to an atmospheric-pressure inert-gas environment (wherein substrates may be transferred to and from factory interface 106).

In some embodiments, load lock 120 may be a stacked load lock having a pair of upper interior chambers and a pair of lower interior chambers that are located at different vertical levels (e.g., one above another). In some embodiments, the pair of upper interior chambers may be configured to receive processed substrates from transfer chamber 110 for removal from process tool 104, while the pair of lower interior chambers may be configured to receive substrates from factory interface 106 for processing in process tool 104. In some embodiments, load lock 120 may be configured to perform a substrate process (e.g., etch and/or pre-clean) on one or more substrates 102 received therein.

Factory interface 106 may be any suitable enclosure, such as, e.g., an Equipment Front End Module or EFEM. Factory interface 106 may be configured to receive substrates 102 from substrate carriers 122 (which may be, e.g., Front Opening Unified Pods or FOUPs) docked at various load ports 124 of factory interface 106. A factory interface robot 126 (shown dotted) may be used to transfer substrates 102 between substrate carriers 122 and load lock 120. Any suitable robot type may be used for factory interface robot 126. Transfers may be carried out in any order or direction. Factory interface 106 may be maintained in, for example, a slightly positive pressure non-reactive gas environment (e.g., using nitrogen as the non-reactive gas).

The movement of transfer robot 112 and factory interface robot 126 and transfer of substrates 102 within and/or between process chambers 114, 116, and 118; load lock 120; factory interface 106; and substrate carriers 122 may be controlled by a motor drive system (not shown in FIG. 1), which may include a plurality of servo or stepper motors.

Electronic device manufacturing system 100 may also include at least one system controller 128. System controller 128 may be coupled to each of the active hardware components to control operation thereof. System controller 128 may include a programmable processor, a memory that stores processor executable instructions/software programs/firmware, various support circuits, and input/output circuits. System controller 128 may also be configured to permit entry and display of data, operating commands, and the like by a human operator.

Electronic device manufacturing system 100 may further include a motion controller 130. Motion controller 130 may include a programmable processor, a memory that stores processor executable instructions/software programs/firmware, various support circuits, and input/output circuits. Motion controller 130 may operate in a closed-loop position control system, which may be referred to as servo control system, to collect and process data from actuator (motion) equipment within electronic device manufacturing system 100 by using various devices that may be coupled to a network both internal and external to the actuator (motion) drives of the actuator (motion) equipment for high-level supervisory tasks beyond commutation of a motor. Motion controller 130 may operate independently of system controller 128, may provide information to system controller 128, and/or may be controlled by system controller 128. Alternatively, system controller 128 may perform the functions of motion controller 130, which may be omitted from electronic device manufacturing system 100.

While process variability tolerance in the semiconductor industry continues to decrease as the size of semiconductor devices shrink, there is a need to maintain a tightly controlled gap between process components during substrate processing (e.g., deposition, annealing, curing, etching, and or other processing of a film on a substrate in a process chamber or load lock).

Process components may include substrate support and process delivery apparatus. Substrate support apparatus may include single or multi-axis actuators (e.g., motors) and may have single or multi-slot (two or more vertically) stacked substrates that may have lifts, elevators, or indexers to transport and support a substrate. Various embodiments of process delivery apparatus may have actuators that may be used to position process delivery assemblies (e.g., pattern masks and/or plasma, gas, or heat distribution assemblies) inside a process chamber or load lock. Examples of such assemblies include cathode assemblies in etch process chambers or load locks, heater pedestal assemblies and gas distribution showerhead assemblies in chemical vapor deposition and atomic layer deposition process chambers, and substrate pattern masking assemblies in bevel etch process chambers or load locks. Bevel edge etching may be used to remove undesirable portions of a deposition film on an edge region of a substrate.

Figure 2:
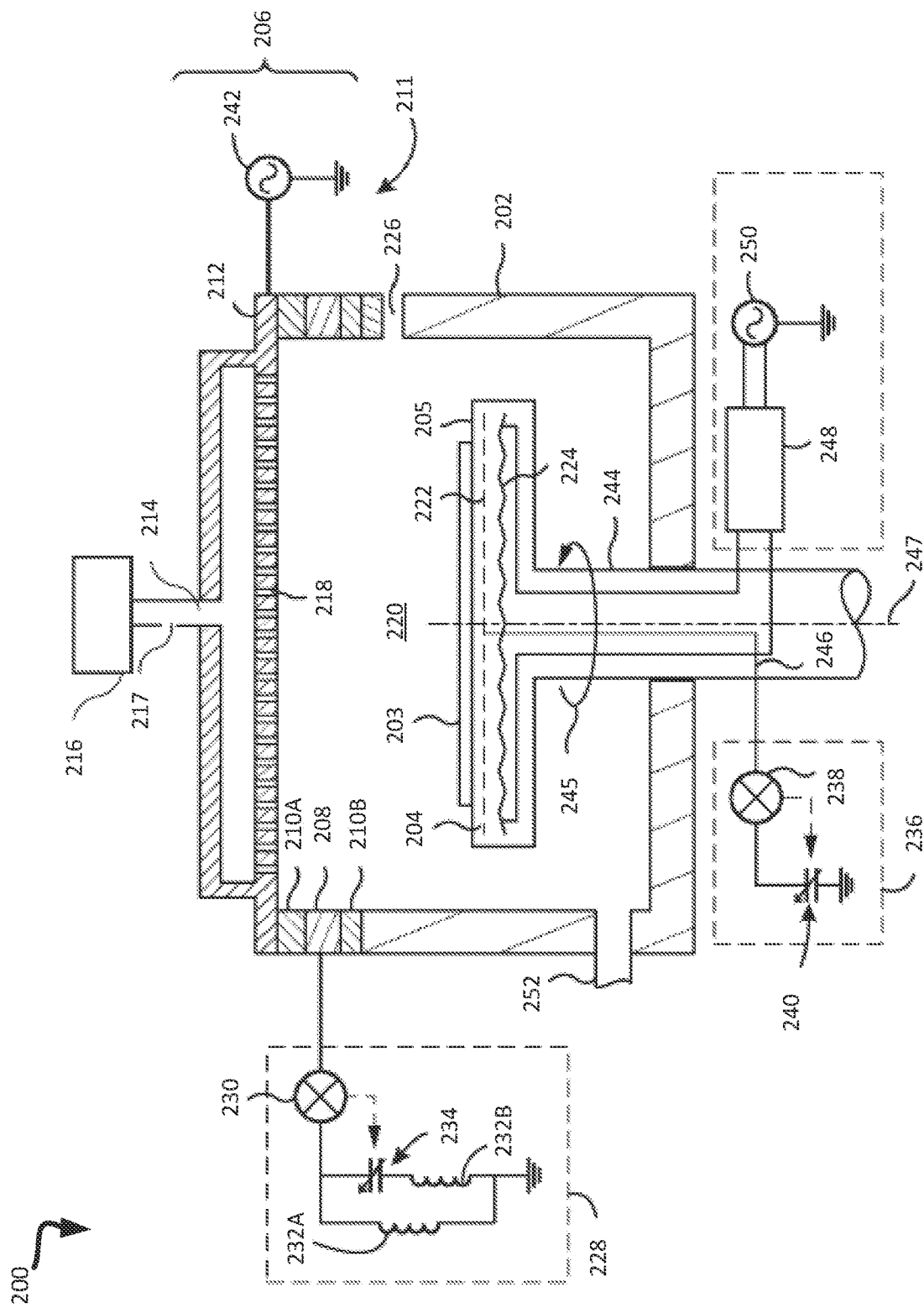
FIG. 2 is a schematic cross-sectional view of an exemplary process chamber for selectively forming a film on a substrate, according to some embodiments.

FIG. 2 is a schematic cross-sectional view of an exemplary process chamber ("chamber") 200 for selectively forming a film on a substrate, according to some embodiments. For example, the chamber 200 may be one of the process chambers 114 through 118 described above with reference to FIG. 1. The chamber 200 may be utilized to form film layers according to some embodiments of the present technology, although it is to be understood that the methods may similarly be performed in any chamber within which film formation may occur. The chamber 200 may be utilized in some embodiments for methods that may include formation, treatment, etching, or conversion of materials for semiconductor structures. It is to be understood that the chamber described is not to be considered limiting, and any chamber that may be configured to perform operations as described may be similarly used.

As shown in FIG. 2, the chamber 200 may include a chamber body 202, a substrate support 204 disposed inside the chamber body 202, and a lid assembly 206 coupled with the chamber body 202 and enclosing the substrate support 204 in a processing volume 220. A substrate 203 may be provided to the processing volume 220 through an opening 226, which may be sealed for processing using a slit valve or door. The substrate 203 may be seated on a surface 205 of the substrate support 204 during processing. The substrate support 204 may be rotatable, as indicated by the arrow 245, along an axis 247, where a shaft 244 of the substrate support 204 may be located. Alternatively, the substrate support 204 may be lifted up to rotate as necessary during a deposition process.

A plasma profile modulator 211 may be disposed in the chamber 200 to control plasma distribution across the substrate 203 disposed on the substrate support 204. The plasma profile modulator 211 may include a first electrode 208 that may be disposed adjacent to the chamber body 202, and may separate the chamber body 202 from other components of the lid assembly 206. The first electrode 208 may be part of the lid assembly 206, or may be a separate sidewall electrode. The first electrode 208 may be an annular or ring-like member, and may be a ring electrode. The first electrode 208 may be a continuous loop around a circumference of the process chamber 200 surrounding the processing volume 220, or may be discontinuous at selected locations if desired. The first electrode 208 may also be a perforated electrode, such as a perforated ring or a mesh electrode, or may be a plate electrode, such as, for example, a secondary gas distributor.

One or more isolators 210a, 210b, which may be a dielectric material such as a ceramic or metal oxide (e.g., aluminum oxide and/or aluminum nitride), may contact the first electrode 208 and separate the first electrode 208 electrically and thermally from a gas distributor 212 and from the chamber body 202. The gas distributor 212 may define apertures 218 for distributing process precursors into the processing volume 220. The gas distributor 212 may be coupled with a first source of electric power 242, such as an RF generator, RF power source, DC power source, pulsed DC power source, pulsed RF power source, or any other power source that may be coupled with the process chamber 200. In some embodiments, the first source of electric power 242 may be an RF power source.

The gas distributor 212 may be a conductive gas distributor or a non-conductive gas distributor. The gas distributor 212 may also be formed of conductive and non-conductive components. For example, a body of the gas distributor 212 may be conductive while a face plate of the gas distributor 212 may be non-conductive. The gas distributor 212 may be powered, such as by the first source of electric power 242 as shown in FIG. 2, or the gas distributor 212 may be coupled with ground in some embodiments.

The first electrode 208 may be coupled with a first tuning circuit 228 that may control a ground pathway of the chamber 200. The first tuning circuit 228 may include a first electronic sensor 230 and a first electronic controller 234. The first electronic controller 234 may be or include a variable capacitor or other circuit elements. The first tuning circuit 228 may be or include one or more inductors 232. The first tuning circuit 228 may be any circuit that enables variable or controllable impedance under the plasma conditions present in the processing volume 220 during processing. In some embodiments as illustrated, the first tuning circuit 228 may include a first circuit leg and a second circuit leg coupled in parallel between ground and the first electronic sensor 230. The first circuit leg may include a first inductor 232A. The second circuit leg may include a second inductor 232B coupled in series with the first electronic controller 234. The second inductor 232B may be disposed between the first electronic controller 234 and a node connecting both the first and second circuit legs to the first electronic sensor 230. The first electronic sensor 230 may be a voltage or current sensor and may be coupled with the first electronic controller 234, which may afford a degree of closed-loop control of plasma conditions inside the processing volume 220.

A second electrode 222 may be coupled with the substrate support 204. The second electrode 222 may be embedded within the substrate support 204 or coupled with a surface of the substrate support 204. The second electrode 222 may be a plate, a perforated plate, a mesh, a wire screen, or any other distributed arrangement of conductive elements. The second electrode 222 may be a tuning electrode, and may be coupled with a second tuning circuit 236 by a conduit 246, for example a cable having a selected resistance, such as 50 ohms, for example, disposed in the shaft 244 of the substrate support 204. The second tuning circuit 236 may have a second electronic sensor 238 and a second electronic controller 240, which may be a second variable capacitor. The second electronic sensor 238 may be a voltage or current sensor, and may be coupled with the second electronic controller 240 to provide further control over plasma conditions in the processing volume 220.

A third electrode 224, which may be a bias electrode and/or an electrostatic chucking electrode, may be coupled with the substrate support 204. The third electrode may be coupled with a second source of electric power 250 through a filter 248, which may be an impedance matching circuit.

The second source of electric power 250 may be DC power, pulsed DC power, RF bias power, a pulsed RF source or bias power, or a combination of these or other power sources. In some embodiments, the second source of electric power 250 may be an RF bias power.

The lid assembly 206 and substrate support 204 of FIG. 2 may be used with any process chamber for plasma or thermal processing. In operation, the process chamber 200 may afford real-time control of plasma conditions in the processing volume 220. The substrate 203 may be disposed on the substrate support 204, and process gases may be flowed through the lid assembly 206 using an inlet 214 according to any desired flow plan. Inlet 114 may include delivery from a remote plasma source unit 216, which may be fluidly coupled with the chamber, as well as a bypass 217 for process gas delivery that may not flow through the remote plasma source unit 216 in some embodiments. Gases may exit the chamber 200 through an outlet 252. Electric power may be coupled with the gas distributor 212 to establish a plasma in the processing volume 220. The substrate may be subjected to an electrical bias using the third electrode 224 in some embodiments.

Upon energizing a plasma in the processing volume 220, a potential difference may be established between the plasma and the first electrode 208. A potential difference may also be established between the plasma and the second electrode 222. The electronic controllers 234, 240 may then be used to adjust the flow properties of the ground paths represented by the two tuning circuits 228 and 236. A set point may be delivered to the first tuning circuit 228 and the second tuning circuit 236 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 228, 236 may have a variable impedance that may be adjusted using the respective electronic controllers 234, 240. Where the electronic controllers 234, 240 are variable capacitors, the capacitance range of each of the variable capacitors, and the inductances of the first inductor 232A and the second inductor 232B, may be chosen to provide an impedance range. This range may depend on the frequency and voltage characteristics of the plasma, which may have a minimum in the capacitance range of each variable capacitor. Hence, when the capacitance of the first electronic controller 234 is at a minimum or maximum, impedance of the first tuning circuit 228 may be high, resulting in a plasma shape that has a minimum aerial or lateral coverage over the substrate support. When the capacitance of the first electronic controller 234 approaches a value that minimizes the impedance of the first tuning circuit 228, the aerial coverage of the plasma may grow to a maximum, effectively covering the entire working area of the substrate support 204. As the capacitance of the first electronic controller 234 deviates from the minimum impedance setting, the plasma shape may shrink from the chamber walls and aerial coverage of the substrate support may decline. The second electronic controller 240 may have a similar effect, increasing and decreasing aerial coverage of the plasma over the substrate support as the capacitance of the second electronic controller 240 may be changed.

The electronic sensors 230, 238 may be used to tune the respective circuits 228, 236 in a closed loop. A set point for current or voltage, depending on the type of sensor used, may be installed in each sensor, and the sensor may be provided with control software that determines an adjustment to each respective electronic controller 234, 240 to minimize deviation from the set point. Consequently, a plasma shape may be selected and dynamically controlled during processing. It is to be understood that, while the foregoing discussion is based on electronic controllers 234, 240, which may be variable capacitors, any electronic component with adjustable characteristic may be used to provide tuning circuits 228 and 236 with adjustable impedance.

Figure 3:
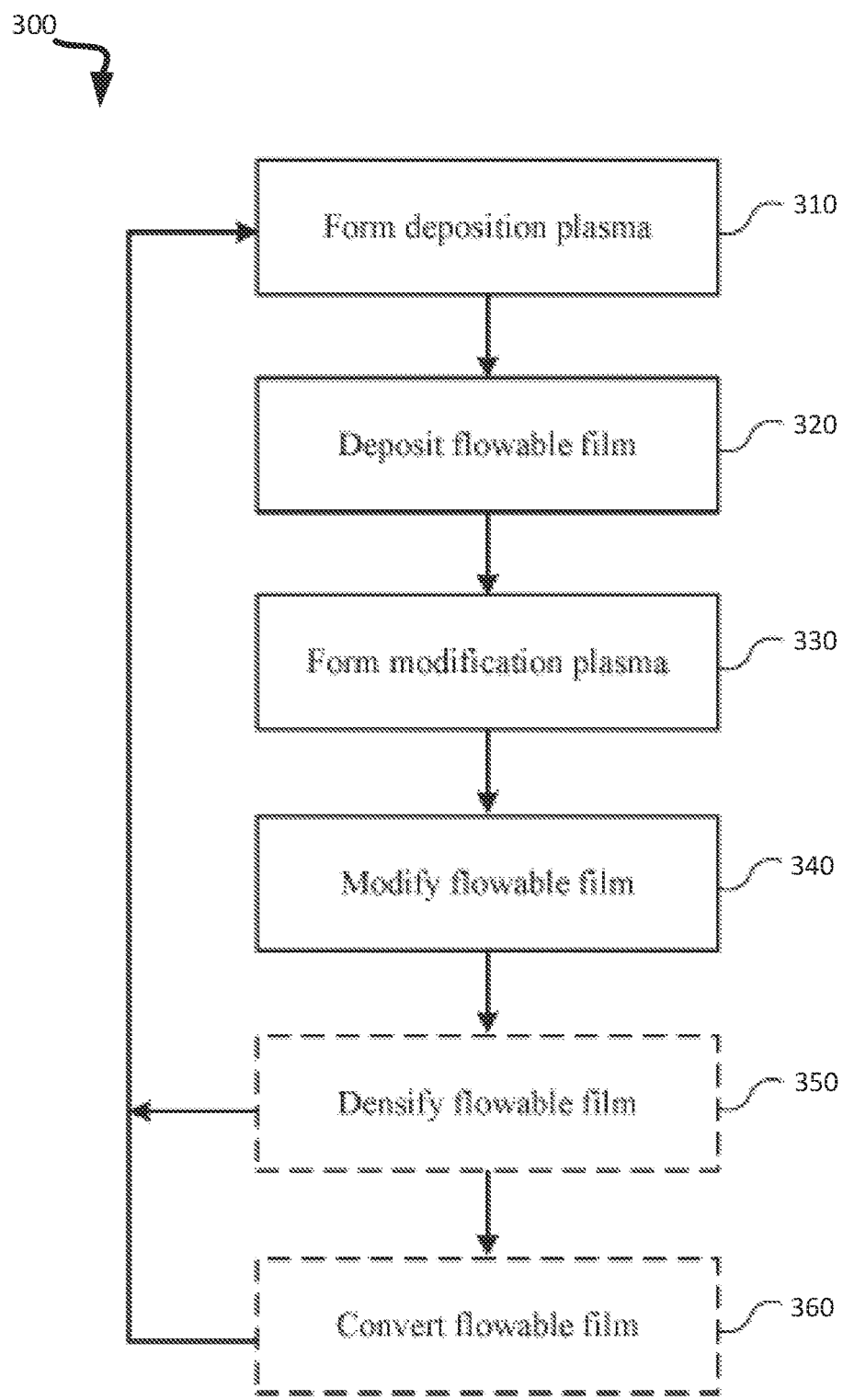
FIG. 3 is a flowchart of a method for selectively forming a film on a substrate, according to some embodiments.

FIG. 3 is a flowchart of a method 300 for selectively forming a film on a substrate, according to some embodiments. Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 300 may describe operations shown schematically in FIGS. 4A-4C, the illustrations of which will be described in conjunction with the operations of method 300. It is to be understood that the figures illustrate only partial schematic views, and a substrate may contain any number of additional materials and features having a variety of characteristics and aspects as illustrated in the figures.

Method 300 may include additional operations prior to initiation of the listed operations. For example, additional processing operations may include forming structures on a semiconductor substrate, which may include both forming and removing material. For example, transistor structures, memory structures, or any other structures may be formed. Prior processing operations may be performed in the chamber in which method 300 may be performed, or processing may be performed in one or more other process chambers prior to delivering the substrate into the semiconductor process chamber or chambers in which method 300 may be performed. Regardless, method 300 may include loading a substrate to a process chamber, such as the chamber 200 of FIG. 2, or other chambers that may include components as described above. The substrate may be deposited on a substrate support, which may be a pedestal such as the substrate support 204 of FIG. 2, and which may reside in a processing region of the process chamber, such as processing volume 220 of FIG. 2.

A substrate on which several operations have been performed may be substrate 405 of a structure 400, which may show a partial view of a substrate on which semiconductor processing may be performed. It is to be understood that structure 400 may show only a few top layers during processing to illustrate aspects of the present technology. The substrate 405 may include a material in which one or more features 410 may be formed. Substrate 405 may be any number of materials used in semiconductor processing. The substrate material may be or include silicon, germanium, dielectric materials including silicon oxide or silicon nitride, metal materials, or any number of combinations of these materials, which may be the substrate 405, or materials formed in structure 400. Features 410 may be characterized by any shape or configuration according to the present technology. In some embodiments, the features may be or include a trench structure or aperture formed within the substrate 405.

Although the features 410 may be characterized by any shapes or sizes, in some embodiments the features 410 may be characterized by higher aspect ratios, or a ratio of a depth of the feature to a width across the feature. For example, in some embodiments, the features 310 may be characterized by aspect ratios greater than or about 5:1, and may be characterized by aspect ratios greater than or about 10:1, greater than or about 15:1, greater than or about 20:1, greater than or about 25:1, greater than or about 30:1, greater than or about 40:1, greater than or about 50:1, or greater. Additionally, the features may be characterized by narrow widths or diameters across the feature including between two sidewalls, such as a dimension less than or about 20 nm, and may be characterized by a width across the feature of less than or about 15 nm, less than or about 12 nm, less than or about 10 nm, less than or about 9 nm, less than or about 8 nm, less than or about 7 nm, less than or about 6 nm, less than or about 5 nm, or less.

In some embodiments, method 300 may include optional treatment operations, such as a pretreatment, that may be performed to prepare a surface of substrate 405 for deposition. Once prepared, method 300 may include delivering one or more precursors to a processing region of the semiconductor process chamber housing the structure 400. The precursors may include one or more silicon-containing precursors, as well as one or more diluents or carrier gases such as an inert gas or other gas delivered with the silicon-containing precursor. A plasma may be formed of the deposition precursors (e.g., silicon-containing precursor) at operation 310. The plasma may be formed within the processing region, which may allow deposition materials to deposit on the substrate. For example, in some embodiments a capacitively-coupled plasma may be formed within the processing region by applying plasma power to the faceplate as previously described.

Figure 4A:
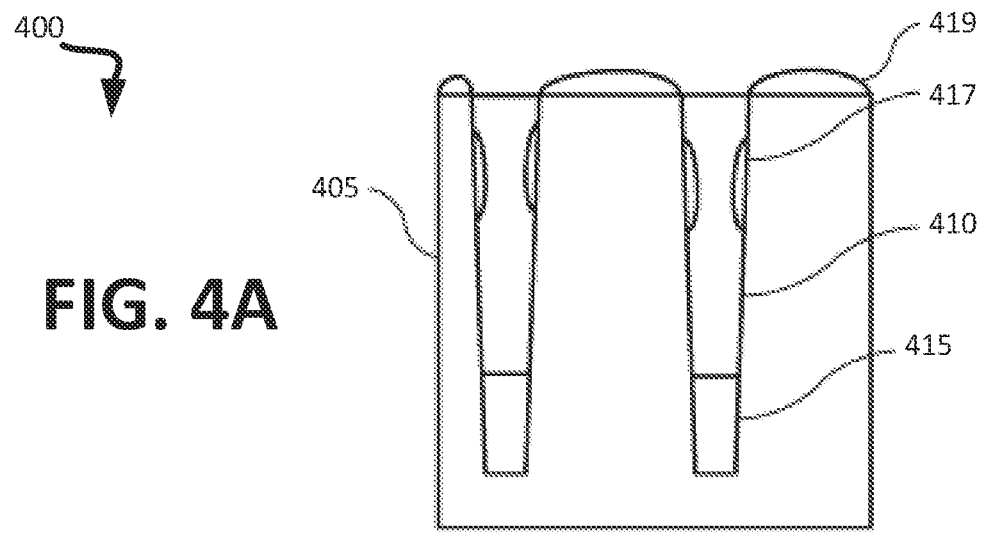
FIGS. 4A-4C are schematic cross-sectional views of a substrate during a method for selectively forming film on the substrate, according to some embodiments.

A flowable film may be deposited on the substrate at operation 320. The deposition material of the flowable film may at least partially flow into the features on the substrate to provide a bottom-up type of gap fill. As illustrated in FIG. 4A, material 415 may be deposited on the substrate 405, and may flow into trenches or features 410. As illustrated, the material 415 may flow into the bottom of the feature, although an amount of material may remain on the sidewalls of the substrate as illustrated with material 417, as well as material on top of, or between, features, as illustrated with material 419. Although the amount deposited may be relatively small, the remaining material on the sidewalls may limit subsequent flow. Additionally, if a conversion were performed of the deposited material, such as a conversion to silicon nitride for example, the conversion would involve an expansion of the film. For reduced dimension features, the residual material formed on the sidewalls may be converted and expand outward towards an opposite sidewall. This may cause the feature to be pinched off, which may form voids within the feature.

In some embodiments, the film includes a silicon material (e.g., amorphous Si). The silicon material can be formed from plasma effluents of the silicon-containing precursor. For example, the film can be a Si film. An Si film deposited using the selective deposition process described herein can have a nitrogen (N) concentration of about 0%, an Si concentration of about 99% and an oxygen (O) concentration of about 1%. Additionally, the Si film deposited using the selective deposition process described herein can have a wet etch rate of less than about 8 Angstroms (Å) per minute, assuming a 1:500 DHF etchant for 60 seconds. The Si film deposited using the selective deposition process can have a bottom layer thickness between about 5 nm to about 10 nm, and a sidewall thickness of less than about 2 nm.

The selective deposition process can be performed using any suitable process window parameters. In some embodiments, the selective deposition process is performed at a temperature between about 25° C. to about 80° C. In some embodiments, the selective deposition process is performed at a source power between about 60 W to about 250 W. In some embodiments the selective deposition process is performed at a bias power between about 100 W to about 200 W. In some embodiments, the selective deposition process is performed with plasma pulsing having a duty cycle between about 1% to about 99%, and a frequency between about 1 Hertz (Hz) to about 20 Hz. In some embodiments, the selective deposition process is performed at a pressure between about 0.5 Torr to about 5 Torr.

The power applied during deposition may be a lower power plasma, which may limit dissociation, and which may maintain an amount of hydrogen incorporation in the deposited materials. This incorporated hydrogen may contribute to the flowability of the materials deposited. Additionally, the present technology may incorporate a bias process, which may produce a treatment to the deposited film during the deposition operations. The process may include utilizing a source power, such as coupled with the faceplate or showerhead as previously described, as well as utilizing a bias power, such as applied through the substrate support as discussed above. The source power may be used to perform a controlled dissociation of the silicon-containing precursor, which may limit dissociation and allow longer material chains to be formed. When these materials contact the substrate, the longer chain silicon-containing materials may have increased flowability, which may improve bottom-up fill.

In some embodiments, to facilitate dissociation and deposition, the deposition precursors may include one or more inert gases, such as argon and/or helium, which may help improve dissociation. Additionally, in some embodiments the deposition precursors may include diatomic hydrogen, which may be flowed to facilitate a treatment process during the deposition, and which may be aided by the bias power provision. For example, hydrogen may be delivered with the silicon-containing precursor at a flow rate ratio of the hydrogen to the silicon-containing precursor of greater than or about 0.5:1, and may be delivered at a flow rate ratio of greater than or about 1:1, greater than or about 1.5:1, greater than or about 2:1, greater than or about 2.5:1, greater than or about 3.0:1, greater than or about 3.5:1, greater than or about 4.0:1, or more.

Figure 4B:
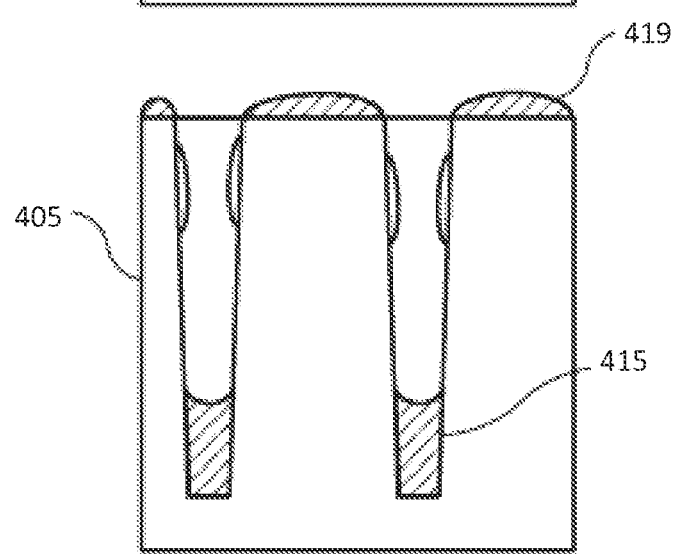

These hydrogen and inert gas radical species may transfer energy to materials along surfaces normal to the direction of travel, such as material along the bottom of features and along the top of features, such as material 415 and 419. The energy may help release excess hydrogen, which may densify the film in these locations. As illustrated in FIG. 4B, while the material 417 along the sidewalls may not be impacted, or may have limited changes, the material 415 and 419 may be densified, which may improve the quality of the materials. Consequently, in some embodiments, material along the top and bottom of the structure may be characterized by a higher quality, which may include an increased density, over material that may have deposited along sidewalls of the features.

However, by utilizing a bias power, the deposition plasma may be characterized by an increased power, which may further dissociate the silicon-containing precursor and reduce flowability. Accordingly, to limit this effect, the bias power may also be pulsed at a pulsing frequency of less than or about 10 kHz, and may be pulsed at a frequency of less than or about 5 kHz, less than or about 1 kHz, less than or about 500 Hz, less than or about 100 Hz, less than or about 50 Hz, less than or about 10 Hz, or less. Additionally, the duty cycle may be operated at less than or about 50%, and may be operated at less than or about 40%, less than or about 30%, less than or about 20%, less than or about 10%, less than or about 5%, or about 1%, which may further reduce the impact of the bias power. By operating the bias power at very low pulsing frequency and duty cycle, the bias power may be utilized to increase film quality at the top of the structure and at the bottom of the feature, while limiting an impact on any other deposition characteristics. Additionally, by utilizing a low power, the hydrogen may not be energized sufficiently to cause etching of the deposited material, or lead to sputtering of the material based on bombardment of the inert gas effluents.

Subsequent an amount of deposition, in some embodiments, an etching process may be performed that is configured to etch back the formed material selectively. This process may be performed in the same chamber as the deposition, and may be performed in a cyclic process to fill the feature. In some embodiments the silicon-containing precursor flow may be halted, and the processing region may be purged. The flow of inert gases, such as argon and/or helium, may also be halted. Subsequent a purge, a hydrogen-containing precursor may be flowed into the processing region of the process chamber. In some embodiments, the etching process may only include a hydrogen-containing precursor, which may be diatomic hydrogen in some embodiments. A modification plasma (e.g., etching plasma) may be formed at operation 330, which may also be a capacitively-coupled plasma formed within the processing region, although in some embodiments an inductively-coupled plasma may similarly be applied.

Similar to the deposition process, during the etching operation, an additional power source may be engaged and coupled with the substrate support as previously described to provide a bias to the plasma generated above the substrate. Accordingly, the etch process may also include both source power and bias power. This may draw plasma effluents to the substrate, which may bombard the film and cause densification of the deposited materials, especially the materials that have already been at least partially improved by the treatment performed during deposition. Although any hydrogen-containing material may be used, in some embodiments diatomic hydrogen may be used as the hydrogen-containing precursor to produce the etching plasma. The hydrogen radicals and ions may readily penetrate the materials formed within the trench, and may release incorporated hydrogen from the film causing densification. The bias power applied may be relatively low to limit sputtering of the produced film as well as to limit any potential damage to the structure. Additionally, by adjusting the source power and the bias power applied, an etching operation may be performed, which may reduce sidewall coverage of the deposited material while limiting an effect on the previously treated materials.

Diatomic hydrogen, or any other hydrogen-containing material, may be utilized to generate a plasma within the processing region by delivering power to the faceplate from the plasma power source. The plasma power in some embodiments may be greater than a plasma power used during the deposition, both from the source power and the bias power. For example, the plasma source power delivered may be greater than or about 100 W, and may be greater than or about 200 W, greater than or about 300 W, greater than or about 400 W, greater than or about 500 W, or more. By increasing the plasma power during the treatment plasma formation, a greater amount of plasma effluents may be generated. However, as plasma power increases, the amount of material etched from the bottom of the structure may also increase. Accordingly, in some embodiments the plasma source power may be maintained at less than or about 500 W, and may be maintained at less than or about 400 W, less than or about 300 W, or less. Additionally, aspects of the bias power may also be adjusted. For example, in some treatment operations the bias power may be higher than the plasma source power, which may provide enough power to the plasma to ensure etching of lower quality materials occurs, such as materials along the sidewalls that may not have been treated during the deposition operation.

Applying greater bias power may increase an ability of the hydrogen to etch deposited materials. While the bias power during deposition may be reduced to limit an etching effect, during the etching operation a bias power, which may be at any of the frequencies noted above, may be increased to greater than or about 500 W, and may be increased to greater than or about 800 W, greater than or about 1000 W, greater than or about 1200 W, greater than or about 1400 W, greater than or about 1600 W, greater than or about 1800 W, or more. However, because the bias power may impart directionality, the bias power may be pulsed as discussed below, which may provide etching of the lower quality material, while maintaining the material previously treated. The plasma effluents may then modify (e.g., etch) the flowable film at operation 340, and may remove portions of the flowable film from the sidewalls of the feature.

Figure 4C:
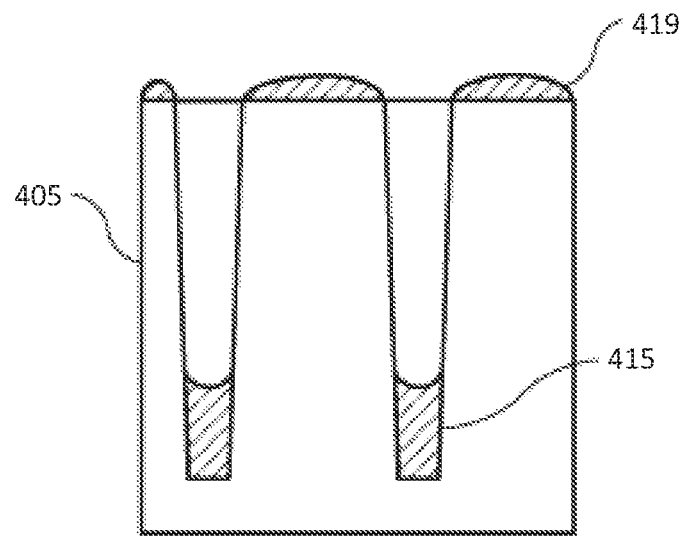

Simultaneously, and beneficially, plasma effluents delivered more directionally may penetrate the remaining flowable film formed at the bottom of the feature, and may reduce hydrogen incorporation to densify the flowable film at optional operation 350. As illustrated in FIG. 4C, material 417 may be removed from sidewalls and overhang regions of the substrate 405, which may maintain the deposited material at bottom regions of the feature and along the top region of the structure. As an added benefit, the densified material 419 at the top of the structure may also protect the underlying material from damage by limiting any impact on the materials. The process may also provide a reduced hydrogen incorporation in the remaining material, such as a hydrogen incorporation of less than or about 40 atomic percent (at. %) and may provide a reduced hydrogen incorporation of less than or about 35 at. %, less than or about 30 at. %, less than or about 25 at. %, less than or about 20 at. %, less than or about 15 at. %, less than or about 10 at. %, less than or about 5 at. %, or less.

Additional adjustments may be made to further increase etching of deposited material along sidewalls of the features by adjusting one or more characteristics of the plasma power or bias power being supplied. For example, in some embodiments both the plasma power source and bias power source may be operated in a continuous wave mode. Additionally, one or both of the power sources may be operated in a pulsed mode. In some embodiments, the source power may be operated in a continuous wave mode while the bias power is operated in a pulsed mode. A pulsing frequency for the bias power may be any of the pulsing frequencies discussed previously. The duty cycle of the bias power may be less than or about 75%, and the bias power may be operated at a duty cycle of less than or about 70%, less than or about 60%, less than or about 50%, less than or about 40%, less than or about 30%, less than or about 20%, less than or about 10%, less than or about 5%, or less. By operating the bias power for a reduced duty cycle, such as an on-time duty of less than or about 50%, a greater amount of time per cycle may be performing a more isotropic etch within the feature, such as during the off time, which may better remove material from the sidewalls.

Additional power configurations may also include an amount of synchronization of the source power and the bias power in a master/slave relationship. For example, both power supplies may be operated in a pulsing orientation, and the bias power may be synchronized to engage after the source power has been engaged at each pulse. A level-to-level pulsing scheme may also be applied. For example, during the on duty of the bias power, the source power may be operated at a first plasma power. During the remainder of the cycle where the bias power is off, the source power may be operated at a second plasma power, which may be greater than the first plasma power. This may both increase isotropic etching by removing the bias-induced directionality, and may also increase etching characteristics of the isotropic etch. The deposition and etch processes may be repeated any number of times in cycles to fill a feature in embodiments of the present technology, which may fill a feature with amorphous silicon.

Additionally, in some embodiments where the silicon may be sought to be converted within the feature, the cycling may also include a conversion operation. By converting during each cycle, penetration issues through the feature may be fully resolved. Also, by performing a conversion operation subsequent the curing and etching, deposited material may be removed from the sidewalls prior to conversion, which may limit film expansion laterally within the trench or feature between sidewalls as previously described. The conversion may be performed in a different chamber from the deposition and treatment, although in some embodiments two or more, including all operations, may be performed within a single process chamber. This may reduce queue times over conventional processes.

Method 300 may also optionally include conversion of the flowable film at operation 360. For example, subsequent the etching and densifying, one or more conversion precursors may be delivered to the processing region of the chamber. For example, a nitrogen-containing precursor, an oxygen-containing precursor, and/or a carbon-containing precursor may be delivered to the processing region of the chamber, along with any carrier or diluent gases. A plasma may be formed of the conversion precursor, which may then contact the amorphous silicon material within the feature. Plasma effluents of the conversion precursor may interact with the amorphous silicon material within the trench, and convert the material to silicon nitride, silicon oxide, silicon carbide, silicon oxynitride, silicon oxycarbide, silicon carbon nitride, or silicon oxycarbonitride, along with any other materials that may be used to convert amorphous silicon films. The plasma power may be similar to powers previously stated. For example, the plasma power may be from about 100 W up to about 1,000 W or more for a capacitively-coupled system, as well as up to 10 kW or more for an inductively-coupled plasma system, although any type of conversion may also be performed.

Although the deposition may be formed to several nanometers or more, by performing an etch process as previously described, the thickness of densified material may be controlled to be at a thickness of less than or about 500 Å, and may be less than or about 450 Å, less than or about 400 Å, less than or about 350 Å, less than or about 300 Å, less than or about 250 Å, less than or about 200 Å, less than or about 150 Å, less than or about 100 Å, less than or about 50 Å, or less. By controlling the thickness of the deposited material, conversion through the entire thickness may be performed more readily, and penetration issues common in conventional processes may be resolved. After a conversion of deposited material, the process may then be fully repeated to continue to produce the converted material up through the feature.

Any number of precursors may be used with the present technology with regard to the deposition precursors used during any of the formation operations. Silicon-containing precursors that may be used during any silicon formation, silicon oxide formation, or silicon nitride formation may include, but are not limited to, silane ($SiH_4$), disilane ($Si_2H_6$), trisilane, or other organosilanes including cyclohexasilanes, silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-containing film formation. By utilizing higher order silanes, longer material chains may be produced, which may increase flowability in some embodiments. The silicon-containing material may be nitrogen-free, oxygen-free, and/or carbon-free in some embodiments. Oxygen-containing precursors used in any operation as described throughout the present technology may include $O_2$, $N_2O$, $NO_2$, $O_3$, $H_2O$, as well as any other oxygen-containing precursors that may be used in silicon oxide film formation, or other film formation. Nitrogen-containing precursors used in any operation may include $N_2$, $N_2O$, $NO_2$, $NH_3$, $N_2H_2$, as well as any other nitrogen-containing precursor that may be used in silicon nitride film formation. Carbon-containing precursors may be or include any carbon-containing material, such as any hydrocarbon, or any other precursor including carbon. In any of the operations one or more additional precursors may be included, such as inert precursors, which may include Ar, He, Xe, Kr, or other materials such as nitrogen, ammonia, hydrogen, or other precursors.

Figure 5:
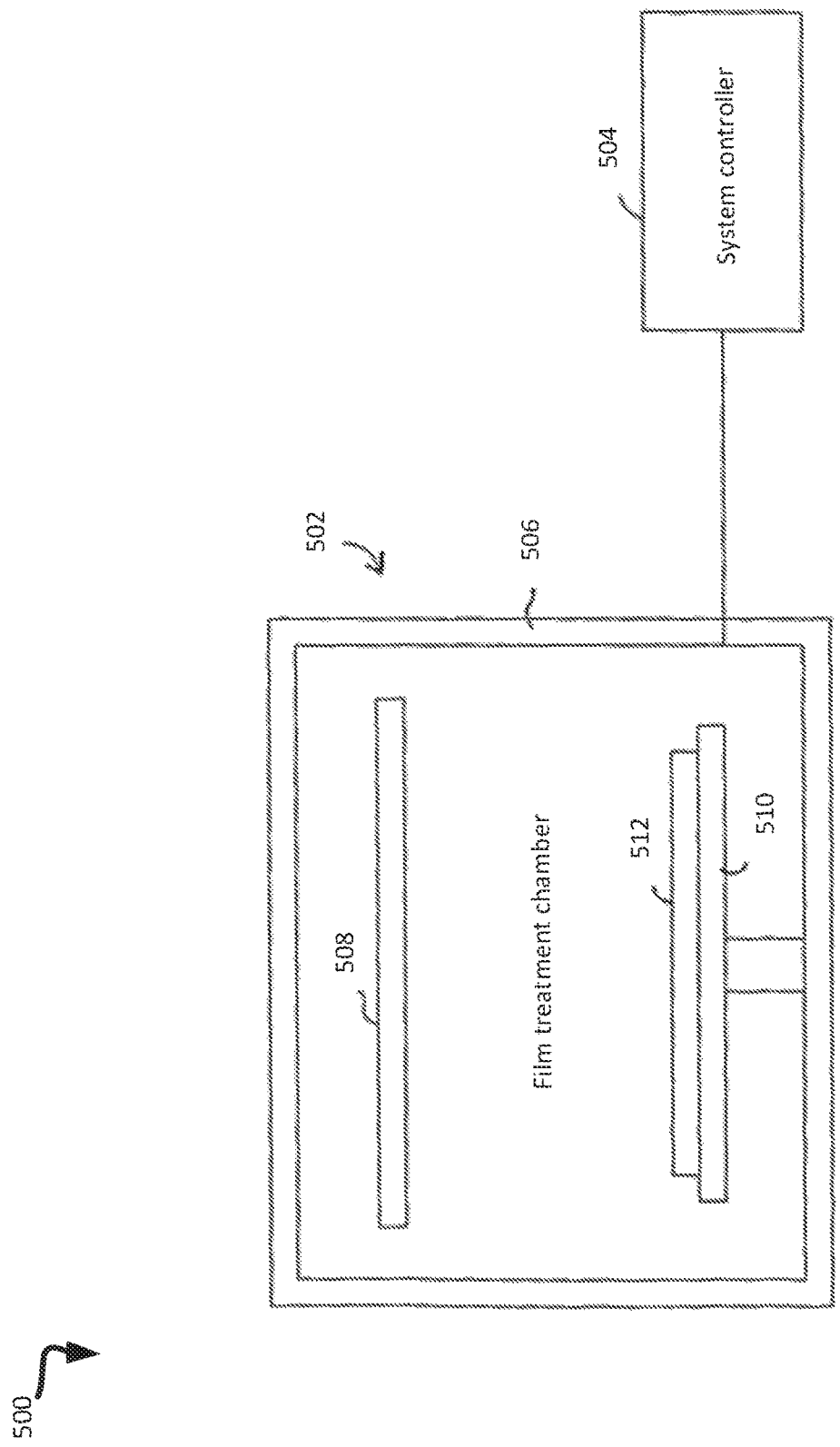
FIG. 5 is a schematic diagram of a film treatment system, according to some embodiments.

FIG. 5 is a schematic diagram of a film treatment system 500, according to some embodiments. The film treatment system 500 includes a film treatment chamber 502 to perform a film treatment process. The film treatment chamber 502 may include a chamber enclosure 506 adapted to surround process kit parts that include a first electrode 508 disposed above a susceptor 510 that supports a substrate 512 during processing. The chamber enclosure 502 includes various inlets and outlets (not shown) provided to flow process gases and/or coolants. The film treatment system 500 can further include a system controller 504 coupled to the nitridation chamber (via one or more wires or cables, wirelessly, etc.). The system controller 504 may include one or more microprocessors, microcontrollers, dedicated hardware, a combination thereof, or the like. In some embodiments, the system controller 504 is configured (e.g., programmed) to cause an aggressive plasma process to be performed within the film treatment chamber 502 before a substrate is loaded into the film treatment chamber 502 for performing film treatment on the substrate. Such an aggressive plasma step may be performed before every substrate is processed (e.g., plasma every substrate) or after some other number of substrates have been processed within the chamber. The system controller 504 also may be adapted to control other processes, such as in accordance with a film treatment process to be performed within the film treatment chamber 502.

The film treatment chamber 502 may include any suitable film treatment chamber. In some embodiments, the film treatment chamber 502 is a plasma film treatment chamber and the system controller 504 is configured to cause a plasma film treatment process to be performed within the film treatment chamber 502. For example, the plasma film treatment process can be an inductively coupled plasma (ICP) plasma film treatment process. In some embodiments, the film treatment chamber 502 is a nitridation chamber, and the system controller 504 is configured to cause a nitridation process to be performed within the film treatment chamber 502. For example, the film treatment chamber 502 can be a decoupled plasma nitridation (DPN) chamber and the nitridation process can be a DPN process, although the plasma employed need not be "decoupled." For example, the film treatment chamber 502 can be a DPN chamber of the 300 mm DPN Centura® system available from Applied Materials, Inc. of Santa Clara, CA. Further details regarding the film treatment process performed within the film treatment chamber 502 will be described below with reference to FIG. 6.

Figure 6:
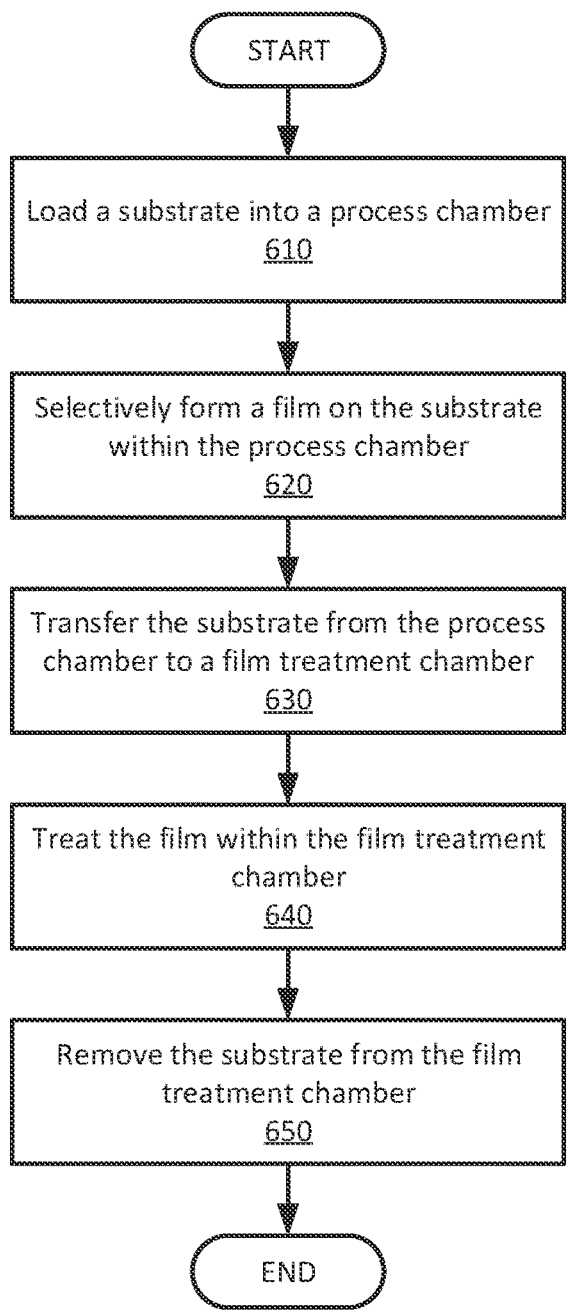
FIG. 6 is a flowchart of a method for forming films with improved film quality, according to some embodiments.

FIG. 6 is a flowchart of a method 600 for forming films with improved film quality, according to some embodiments. Method 600 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

At operation 610, a substrate is loaded into a process chamber of an electronic device manufacturing system. For example, at least one system controller can cause the substrate to be loaded into the process chamber. More specifically, the at least one system controller can cause a transfer robot to load the substrate onto a substrate support within the process chamber. For example, the electronic device manufacturing system can be the electronic device manufacturing system 100 of FIG. 1, the process chamber can be one of the process chambers 114, 116, 118 (e.g., chamber 200 of FIG. 2), the transfer robot can be the transfer robot 112 of FIG. 1 and the at least one system controller can include the system controller 128 of FIG. 1.

At operation 620, a film is selectively formed on the substrate within the process chamber. For example, the at least one system controller can cause the film to be selectively formed on the substrate within the process chamber. More specifically, the at least one system controller can cause a flowable film (e.g., Si film) to be deposited on the substrate by causing a first input flow to be provided within a processing volume of the process chamber, and can cause a portion of the flowable film to be removed (e.g., etched) from a sidewall of a feature of the substrate to obtain a remaining portion of the flowable film by causing a second input flow to be provided within the processing volume. The first input flow can include plasma effluents of a first precursor, and the second input flow can include plasma effluents of a second precursor. In some embodiments, the first precursor is a silicon-containing precursor, and the second precursor is a hydrogen-containing precursor.

The deposition process can be performed using any suitable process window parameters. In some embodiments, the deposition process is performed at a temperature between about 25° C. to about 100° C. More specifically, the temperature can be about 80° C. In some embodiments, the deposition process is performed at a source power between about 60 W to about 250 W. In some embodiments the selective deposition process is performed at a bias power between about 100 W to about 200 W. In some embodiments, the deposition process is performed with plasma pulsing having a duty cycle between about 1% to about 99%, and a frequency between about 1 Hertz (Hz) to about 20 Hz. In some embodiments, the deposition process is performed at a pressure between about 0.5 Torr to about 5 Torr. In some embodiments, the deposition process is performed for a time ranging from about 5 s to about 15 s. More specifically, the deposition process can be performed for about 13 s.

Selectively forming the film can further include densifying the film. For example, the at least one system controller can cause the remaining portion of the flowable film to be densified. More specifically, the at least one system controller can cause hydrogen content of the remaining portion of the flowable film to be reduced to obtain a densified film by causing a third input flow to be provided within the processing volume. The third input flow can include plasma effluents of a third precursor. In some embodiments, third precursor is a hydrogen-containing precursor. Further details regarding the selective film deposition process are described above with reference to FIGS. 1-4.

At operation 630, the substrate is transferred from the process chamber to a film treatment chamber. For example, the at least one system controller can cause the substrate to be transferred from the process chamber to the film treatment chamber. More specifically, the at least one system controller can cause the transfer robot to remove the substrate from the process chamber, rotate into alignment with the film treatment chamber, and place the substrate on a substrate support within the film treatment chamber. For example, the film treatment chamber can be one of the process chambers 114, 116, 118 of FIG. 1 (e.g., the film treatment chamber 502 of FIG. 5).

At operation 640, the film is treated within the film treatment chamber. For example, the at least one system controller can cause the film to be treated within the film treatment chamber in accordance with a film treatment process. More specifically, the at least one system controller can cause the remaining portion of the flowable film to be treated within the film treatment chamber in accordance with the film treatment process. In some embodiments, an aggressive plasma step is performed within the film treatment chamber prior to performing the film treatment process.

The film treatment process can include a plasma film treatment process. For example, the plasma film treatment process can be an ICP plasma film treatment process. In some embodiments, the film treatment chamber is a nitridation chamber, and the film treatment process includes a nitridation process. In some embodiments, the film treatment process can be a DPN process.

For example, the DPN process can be used to form a silicon nitride material (e.g., $Si_xN_y$) from a Si film. The silicon nitride material formed using the DPN process described herein can have a wet etch rate of less than about 4 Å per minute, assuming a 1:500 DHF etchant for 60 seconds. In some embodiments, the silicon nitride material has a wet etch rate of less than about 1 Å per minute, assuming a 1:500 DHF etchant for 60 seconds. In some embodiments, the silicon nitride material has a wet etch rate of about 0.6 Å per minute, assuming a 1:500 DHF etchant for 60 seconds. The silicon nitride material can have an N concentration of about 55%, a Si concentration of about 45% and an O concentration of about 0%.

During the DPN process, a film can be infused with nitrogen. For example, the at least one system controller can cause low-energy, pulsed plasma to be introduced within the DPN chamber to create the desired nitrogen concentration at respective interfaces for preserving high channel mobility. The at least one system controller can further cause direct, high temperature heating to generate higher dosages of nitrogen for oxynitride gates at the 3× and 2× nm nodes while simultaneously achieving improved leakage and threshold voltage performance. Other nitridation processes can be limited in achieving the requisite leakage and threshold voltage.

The film treatment process can be performed using any suitable process window parameters. Illustratively, to perform the DPN process, the at least one system controller can cause the temperature with the DPN chamber to range between about 200° C. to about 500° C. More specifically, the temperature can be about 450° C. The at least one system controller can cause the source power to range between about 100 W to about 250 W. The at least one system controller can cause the bias power to range between about 100 W to about 600 W. The at least one system controller can cause the pressure with the DPN chamber to range between about 5 milliTorr to about 100 milliTorr. The at least one system controller can cause the DPN process to be performed for a time ranging between about 5 s to about 15 s. More specifically, the DPN process can be performed for about 10 s.

Any additional post-treatment steps may be employed (e.g., deposition, etch, anneal). For example, the concentration of the matter used to treat the film (e.g., nitrogen) can decrease over time following the treatment. To counteract this effect, the at least one system controller can cause a high temperature anneal to be performed immediately following the film treatment process. The high temperature anneal can be performed in a separate chamber from the film treatment process. For example, the high temperature anneal can be a PNA process performed after nitridation to eliminate an unstable bonding phase that can cause variation in threshold voltage. By reducing or removing this unstable bonding phase, the PNA can contribute to improved device performance.

At operation 650, the substrate is removed from the film treatment chamber. For example, the at least one system controller can cause the substrate to be removed from the film treatment chamber. More specifically, the at least one system controller can cause the transfer robot to remove the substrate from the film treatment chamber.

In some embodiments, the substrate can then be placed within another process chamber for further post-treatment processing. For example, at least one system controller can cause the substrate to be placed within the other process chamber. More specifically, the at least one system controller can cause the transfer robot to place the substrate within the other process chamber.

In some embodiments, the substrate can then be placed within a load lock (e.g., load lock 120 of FIG. 1). For example, at least one system controller can cause the substrate to be placed within the load lock. More specifically, the at least one system controller can cause the transfer robot to place the substrate within the load lock. Further details regarding operations 610-650 are described above with reference to FIGS. 1-5 and will now be described below with reference to FIG. 7.

Figure 7:
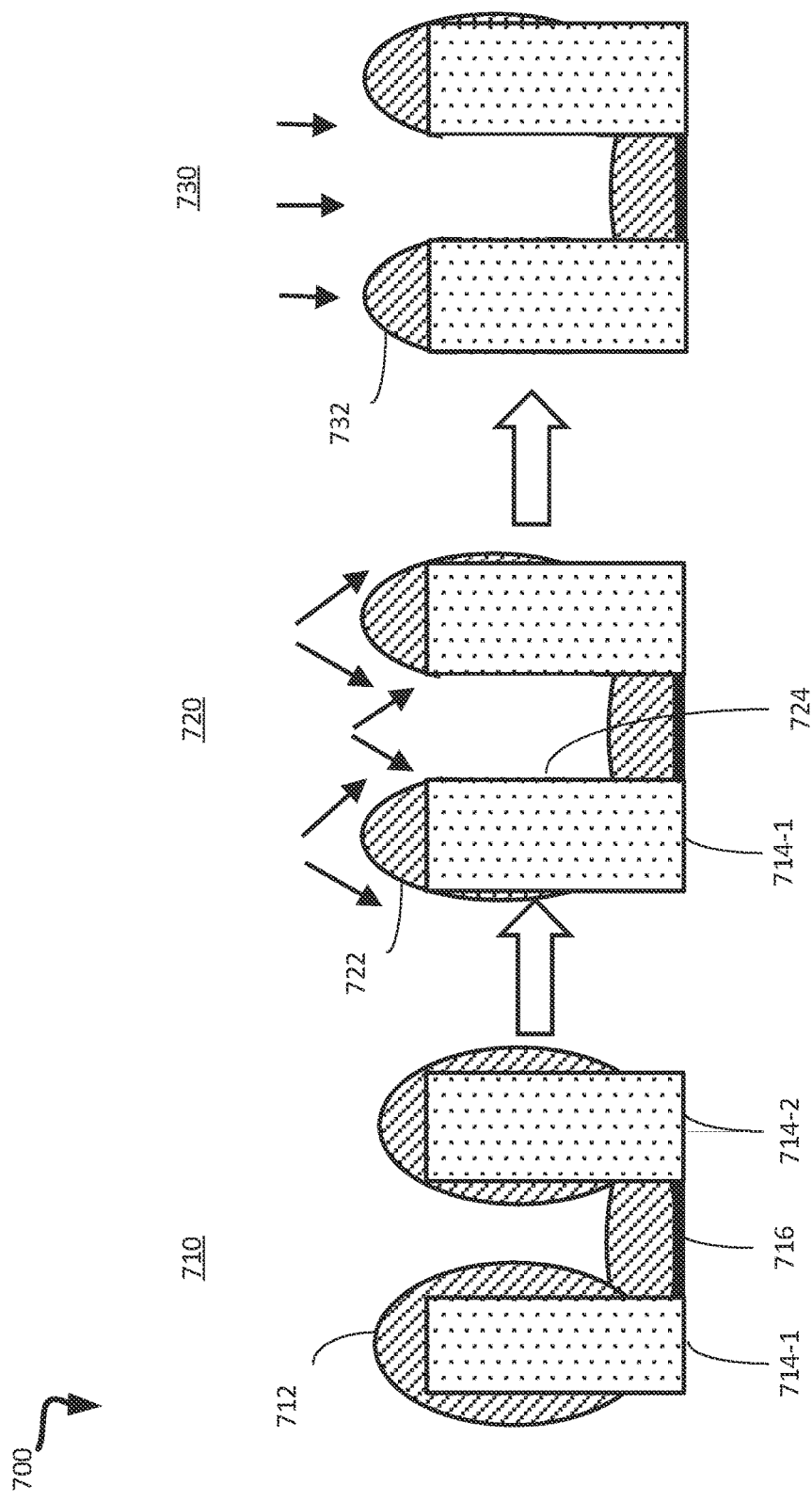
FIG. 7 is a diagram of schematic cross-sectional views during a method for forming films with improved film quality, according to some embodiments.

FIG. 7 is a diagram 700 of schematic cross-sectional views during a method for forming films with improved film quality, according to some embodiments. The diagram 700 shows a deposition step 710 and a film removal step 720. Steps 710 and 720 can be performed during operation 620 described above with reference to FIG. 6. Step 720 can be performed in-situ after step 710 (e.g., without exposing the substrate to air between step 710 and step 720). For example, during the deposition step 710, a flowable film 712 is deposited on a substrate including features 714-1 and 714-2 and a bottom surface 716. During the film removal step 720, an etch process can be performed to remove a portion of the flowable film 712 and obtain a remaining portion of flowable film 722. The removal of the portion of the flowable film 712 further exposes sidewalls of the feature 714-1 and 714-2, including sidewall 724 of the feature 714-1. The etch process can be a dry etch process (e.g., an $H_2$ plasma etch process). In some embodiments, the remaining portion of the flowable film 722 can be densified, as described in further detail above.

The diagram 700 further shows a film treatment step 730. Step 730 can be performed during operation 640 described above with reference to FIG. 6. Step 730 can be performed ex-situ after step 720. During the film treatment step 710, the remaining portion of the flowable film 722 (e.g., densified film) is treated to obtain treated film 732. For example, the remaining portion of the flowable film 722 can be treated using a DPN process. Further details regarding steps 710-730 are described above with reference to FIGS. 1-6.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method comprising:
depositing a film on a substrate by providing a first input flow, the first input flow comprising plasma effluents of a first precursor;
reducing hydrogen content of the film to obtain a densified film by providing a second input flow, the second input flow comprising plasma effluents of a second precursor; and
removing a portion of the densified film from a sidewall of a feature defined within the substrate to obtain a remaining portion of the film by providing a third input flow, the third input flow comprising plasma effluents of a third precursor; and
treating the remaining portion of the film in accordance with a film treatment process.

2. The method of claim 1, wherein the depositing, the removing and the reducing are performed within a process chamber, and wherein the treating is performed within a film treatment chamber different from the process chamber.

3. The method of claim 1, wherein at least one of the second precursor or the third precursor comprises a hydrogen-containing precursor.

4. The method of claim 1, wherein first the precursor comprises a silicon-containing precursor and the film comprises silicon.

5. The method of claim 1, wherein the depositing is performed using a set of process window parameters, and wherein the set of process window parameters comprises at least one of:
a temperature between about 25° C. to about 100° C.;
a source power between about 60 Watts (W) to about 250 W;
a bias power between about 100 W to about 2000 W;
a plasma pulsing having a duty cycle between about 1% to about 99%, and a frequency between about 1 Hertz (Hz) to about 20 Hz;
a pressure between about 0.5 Torr to about 100 Torr; or
a time between about 5 seconds(s) to about 15 s.

6. The method of claim 1, wherein the film treatment process is a decoupled plasma nitridation (DPN) process performed using a set of process window parameters to achieve a wet etch rate of less than about 4 Angstroms per minute.

7. The method of claim 6, wherein the set of process window parameters comprises at least one of:
a temperature between about 200° C. to about 500° C.;
a source power between about 100 Watts (W) to about 250 W;
a bias power between about 100 W to about 600 W;
a pressure between about 5 milliTorr to about 100 milliTorr; or
a time between about 5 seconds(s) to about 15 s.

8. A system comprising:
at least one system controller comprising a processor operatively coupled to a memory and configured to:
cause film to be deposited on a substrate by causing a first input flow to be provided, the first input flow comprising plasma effluents of a first precursor;
cause hydrogen content of the film to be reduced to obtain a densified film by causing a second input flow to be provided, the second input flow comprising plasma effluents of a second precursor; and
cause a portion of the densified film to be removed from a sidewall of a feature defined within the substrate to obtain a remaining portion of the film by causing a third input flow to be provided, the third input flow comprising plasma effluents of a third precursor; and
cause the remaining portion of the film to be treated in accordance with a film treatment process.

9. The system of claim 8, wherein the at least one system controller is configured to:
cause the film to be deposited on the substrate within a process chamber;
cause hydrogen content of the film to be reduced to obtain the densified film within the process chamber;
cause the portion of the densified film to be removed from the sidewall of the feature within the process chamber; and
cause the remaining portion of the film to be treated in accordance with a film treatment process within a film treatment chamber different from the process chamber.

10. The system of claim 8, wherein at least one of the second precursor or the third precursor comprises a hydrogen-containing precursor.

11. The system of claim 8, wherein the first precursor comprises a silicon-containing precursor and the film comprises silicon.

12. The system of claim 8, wherein the film is deposited using a set of process window parameters, and wherein the set of process window parameters comprises at least one of:
a temperature between about 25° C. to about 100° C.;
a source power between about 60 Watts (W) to about 250 W;
a bias power between about 100 W to about 2000 W;
a plasma pulsing having a duty cycle between about 1% to about 99%, and a frequency between about 1 Hertz (Hz) to about 20 Hz;
a pressure between about 0.5 Torr to about 100 Torr; or
a time between about 5 seconds(s) to about 15 s.

13. The system of claim 8, wherein the film treatment process is a decoupled plasma nitridation (DPN) process performed using a set of process window parameters to achieve a wet etch rate of less than about 4 Angstroms per minute.

14. The system of claim 13, wherein the set of process window parameters comprises at least one of:
a temperature between about 200° C. to about 500° C.;
a source power between about 100 Watts (W) to about 250 W;
a bias power between about 100 W to about 600 W;
a pressure between about 5 milliTorr to about 100 milliTorr; or
a time between about 5 seconds(s) to about 15 s.

15. An electronic device manufacturing system, comprising:
a process chamber comprising a first substrate support;
a film treatment chamber comprising a second substrate support;
a transfer chamber coupled to the process chamber and the film treatment chamber, wherein the transfer chamber houses a transfer robot; and
at least one system controller, operatively coupled to the process chamber, the film treatment chamber and the transfer robot, configured to:
cause the transfer robot to load a substrate on the first substrate support within the process chamber, wherein the substrate comprises a feature defined within the substrate;
cause a film to be deposited on the substrate within the process chamber by causing a first input flow to be provided within a processing volume of the process chamber, the first input flow comprising plasma effluents of a first precursor;

cause, within the process chamber, hydrogen content of the film to be reduced to obtain a densified film by causing a second input flow to be provided within the processing volume, the second input flow comprising plasma effluents of a second precursor;

cause, within the process chamber, a portion of the densified film to be removed from a sidewall of the feature to obtain a remaining portion of the film by causing a third input flow to be provided within the processing volume, the third input flow comprising plasma effluents of a third precursor;

cause the transfer robot to transfer the substrate from the process chamber to the film treatment chamber and on the second substrate support; and cause the densified film to be treated within the film treatment chamber in accordance with a film treatment process.

16. The electronic device manufacturing system of claim 15, wherein the first precursor comprises a silicon-containing precursor and the film comprises silicon.

17. The electronic device manufacturing of claim 15, wherein at least one of the second precursor or the third precursor comprises a hydrogen-containing precursor.

18. The electronic device manufacturing of claim 15, wherein the film is deposited using a set of process window parameters, and wherein the set of process window parameters comprises at least one of:

a temperature between about 25° C. to about 100° C.;

a source power between about 60 Watts (W) to about 250 W;

a bias power between about 100 W to about 2000 W;

a plasma pulsing having a duty cycle between about 1% to about 99%, and a frequency between about 1 Hertz (Hz) to about 20 Hz;

a pressure between about 0.5 Torr to about 100 Torr; or a time between about 5 seconds(s) to about 15 s.

19. The electronic device manufacturing of claim 15, wherein the film treatment process is a DPN process performed using a set of process window parameters to achieve a wet etch rate of less than about 4 Angstroms per minute.

20. The electronic device manufacturing of claim 19, wherein the set of process window parameters comprises at least one of:

a temperature between about 200° C. to about 500° C.;

a source power between about 100 Watts (W) to about 250 W;

a bias power between about 100 W to about 600 W;

a pressure between about 5 milliTorr to about 100 milliTorr; or a time between about 5 seconds(s) to about 15 s.

* * * * *